US010909670B2

(12) United States Patent
Milstein et al.

(10) Patent No.: US 10,909,670 B2
(45) Date of Patent: Feb. 2, 2021

(54) COMPUTATIONAL RECONFIGURABLE IMAGING SPECTROMETER

(71) Applicant: Massachusetts Institute of Technology, Cambridge, MA (US)

(72) Inventors: Adam Milstein, Winchester, MA (US); Charles Wynn, Groton, MA (US); Yaron Rachlin, Newton, MA (US); Ryan Sullenberger, Somerville, MA (US); Sumanth Kaushik, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 82 days.

(21) Appl. No.: 16/212,013

(22) Filed: Dec. 6, 2018

(65) Prior Publication Data

US 2020/0410653 A1  Dec. 31, 2020

(51) Int. Cl.
*G01J 5/02* (2006.01)
*G06T 5/50* (2006.01)
(Continued)

(52) U.S. Cl.
CPC ............. *G06T 5/50* (2013.01); *G01J 3/02* (2013.01); *G01J 3/0229* (2013.01);
(Continued)

(58) Field of Classification Search
CPC ............ G06T 5/50; G06T 5/003; G06T 2207/20076; G06T 2207/20212;
(Continued)

(56) References Cited

U.S. PATENT DOCUMENTS

| 7,002,679 B2 | 2/2006 | Brady et al. |
| 7,092,101 B2 | 8/2006 | Brady et al. |

(Continued)

FOREIGN PATENT DOCUMENTS

WO   2016191157 A1   12/2016

OTHER PUBLICATIONS

International Search Report and Written Opinion in International Patent Application No. PCT/US18/64265 dated Mar. 5, 2019, 16 pages.

(Continued)

*Primary Examiner* — Kiho Kim
(74) *Attorney, Agent, or Firm* — Smith Baluch LLP

(57) ABSTRACT

Hyperspectral imaging spectrometers have applications in environmental monitoring, biomedical imaging, surveillance, biological or chemical hazard detection, agriculture, and minerology. Nevertheless, their high cost and complexity has limited the number of fielded spaceborne hyperspectral imagers. To address these challenges, the wide field-of-view (FOV) hyperspectral imaging spectrometers disclosed here use computational imaging techniques to get high performance from smaller, noisier, and less-expensive components (e.g., uncooled microbolometers). They use platform motion and spectrally coded focal-plane masks to temporally modulate the optical spectrum, enabling simultaneous measurement of multiple spectral bins. Demodulation of this coded pattern returns an optical spectrum in each pixel. As a result, these computational reconfigurable imaging spectrometers are more suitable for small space and air platforms with strict size, weight, and power constraints, as well as applications where smaller or less expensive packaging is desired.

20 Claims, 12 Drawing Sheets

(51) Int. Cl.
    *H04N 5/372*      (2011.01)
    *H04N 5/357*      (2011.01)
    *G06T 5/00*      (2006.01)
    *G01J 3/28*      (2006.01)
    *G01J 3/02*      (2006.01)

(52) U.S. Cl.
    CPC .......... *G01J 3/2823* (2013.01); *G01J 3/2846* (2013.01); *G06T 5/003* (2013.01); *H04N 5/357* (2013.01); *H04N 5/37206* (2013.01); *G06T 2207/10032* (2013.01); *G06T 2207/20076* (2013.01); *G06T 2207/20212* (2013.01); *G06T 2207/30181* (2013.01)

(58) Field of Classification Search
    CPC .......... G06T 2207/10032; G06T 2207/30181; H04N 5/357; H04N 5/37206; G01J 3/0229; G01J 3/02; G01J 3/2823; G01J 3/2846
    See application file for complete search history.

(56) References Cited

U.S. PATENT DOCUMENTS

| | | |
|---|---|---|
| 7,283,231 B2 | 10/2007 | Brady et al. |
| 7,283,232 B2 | 10/2007 | Brady et al. |
| 7,301,625 B2 | 11/2007 | Brady et al. |
| 7,336,353 B2 | 2/2008 | Brady et al. |
| 7,399,957 B2 | 7/2008 | Parker et al. |
| 7,427,932 B2 | 9/2008 | Brady et al. |
| 7,432,843 B2 | 10/2008 | Brady et al. |
| 7,463,174 B2 | 12/2008 | Brady et al. |
| 7,463,179 B2 | 12/2008 | Brady et al. |
| 7,505,130 B2 | 3/2009 | Brady et al. |
| 7,532,772 B2 | 5/2009 | Brady |
| 7,561,274 B2 | 7/2009 | Brady et al. |
| 7,573,579 B2 | 8/2009 | Brady |
| 7,616,306 B2 | 11/2009 | Brady et al. |
| 7,773,218 B2 | 8/2010 | Brady et al. |
| 7,912,173 B2 | 3/2011 | Brady |
| 8,149,400 B2 | 4/2012 | Brady et al. |
| 8,553,222 B2 * | 10/2013 | Brady .................. G01J 3/02 356/310 |
| 10,004,464 B2 | 6/2018 | Brady et al. |
| 10,107,768 B2 | 10/2018 | Brady et al. |
| 2002/0057431 A1 | 5/2002 | Fateley et al. |
| 2004/0207855 A1 | 10/2004 | Brady et al. |
| 2005/0254047 A1 | 11/2005 | Brady et al. |
| 2006/0038705 A1 | 2/2006 | Brady et al. |
| 2006/0274308 A1 | 12/2006 | Brady et al. |
| 2007/0080290 A1 | 4/2007 | Parker et al. |
| 2007/0081158 A1 | 4/2007 | Brady et al. |
| 2007/0091315 A1 | 4/2007 | Brady et al. |
| 2007/0097363 A1 | 5/2007 | Brady et al. |
| 2007/0296965 A1 | 12/2007 | Brady et al. |
| 2007/0296969 A1 * | 12/2007 | Goldstein ............. G01J 3/0229 356/328 |
| 2008/0025624 A1 | 1/2008 | Brady |
| 2008/0088841 A1 | 4/2008 | Brady |
| 2008/0106732 A1 | 5/2008 | Brady et al. |
| 2010/0245634 A1 * | 9/2010 | Ahdoot .................. H04N 9/045 348/250 |
| 2014/0153692 A1 * | 6/2014 | Larkin .................. G01N 23/04 378/36 |
| 2016/0165155 A1 | 6/2016 | Qin et al. |

OTHER PUBLICATIONS

Mahgoub et al., "Aligning the frames of a non stationary imaging Fourier transform spectrometer for spectrum retrieval." 2009 16th IEEE International Conference on Image Processing (ICIP). IEEE, 2009.
Sullenberger et al., "Computational reconfigurable imaging spectrometer." Optics express 25.25 (2017): 31960-31969.
Adam et al., "Multispectral and hyperspectral remote sensing for identification and mapping of wetland vegetation: a review." Wetlands Ecology and Management 18.3 (2010): 281-296.
Boyd et al., "Distributed optimization and statistical learning via the alternating direction method of multipliers." Foundations and Trends® in Machine learning 3, No. 1 (2011): 1-122.
Feng et al., "Application of hyperspectral imaging in food safety inspection and control: a review." Critical reviews in food science and nutrition 52.11 (2012): 1039-1058.
Gehm et al., "High-throughput, multiplexed pushbroom hyperspectral microscopy." Optics Express 16.15 (2008): 11032-11043.
Govender et al., "A review of hyperspectral remote sensing and its application in vegetation and water resource studies." Water Sa 33.2 (2007). 8 pages.
Kruse, "Mapping surface mineralogy using imaging spectrometry." Geomorphology 137.1 (2012): 41-56.
Lee et al., "Water and bottom properties of a coastal environment derived from Hyperion data measured from the EO-1 spacecraft platform." Journal of Applied Remote Sensing 1.1 (2007): 011502. 16 pages.
Lin, "Single-shot hyperspectral multiplexed imaging using a computational imaging array (Conference Presentation)", Proc. SPIE 10222, Computational Imaging II, 1022207 (Jul. 6, 2017); doi: 10.1117/12.2262968; https://doi.org/10.1117/12.2262968. 16 pages.
Lucey et al., "A Fabry-Perot interferometer with a spatially variable resonance gap employed as a Fourier transform spectrometer." Algorithms and Technologies for Multispectral, Hyperspectral, and Ultraspectral Imagery XVII. vol. 8048. International Society for Optics and Photonics, 2011. 10 pages.
Martin et al., "Development of an advanced hyperspectral imaging (HSI) system with applications for cancer detection." Annals of biomedical engineering 34.6 (2006): 1061-1068.
Multiframe Coded Aperture Spectral Imaging (CASSI), Mar. 9, 2013 (downloaded from https://web.archive.org/web/20130309012509/ http://www.disp.duke.edu/projects/Multi_CASSI/ on Dec. 6, 2018), 3 pages.
Paige et al., "LSQE: An algorithm for sparse linear equations and sparse least squares." ACM Transactions on Mathematical Software (TOMS) 8, No. 1 (1982): 43-71.
Schumann et al., "Infrared hyperspectral imaging Fourier transform and dispersive spectrometers: comparison of signal-to-noise-based performance." Imaging Spectrometry VII. vol. 4480. International Society for Optics and Photonics, 2002. 15 pages.
Sharpe et al., "Gas-phase databases for quantitative infrared spectroscopy." Applied Spectroscopy 58.12 (2004): 1452-1461.
Sorg et al.., "Hyperspectral imaging of hemoglobin saturation in tumor microvasculature and tumor hypoxia development." Journal of biomedical optics 10.4 (2005): 044004. 11 pages.
Walsh et al., "QuickBird and Hyperion data analysis of an invasive plant species in the Galapagos Islands of Ecuador: Implications for control and land use management." Remote Sensing of Environment 112.5 (2008): 1927-1941.
Yuen et al., "An introduction to hyperspectral imaging and its application for security, surveillance and target acquisition." The Imaging Science Journal 58.5 (2010): 241-253.

* cited by examiner (a) 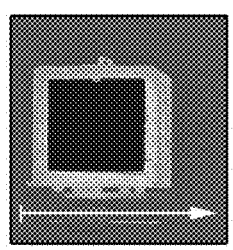
(b) 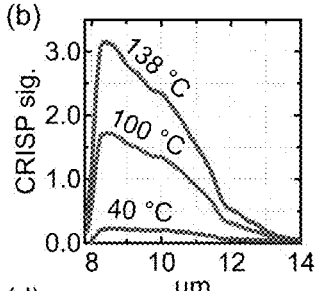
FIG. 6A
FIG. 6B
(c) 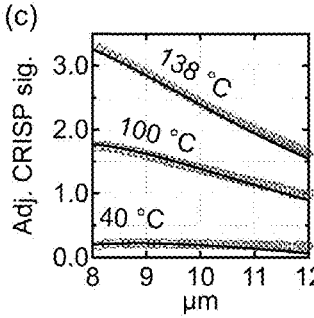
(d) 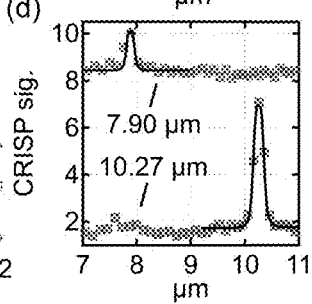
FIG. 6C
FIG. 6D

COMPUTATIONAL RECONFIGURABLE IMAGING SPECTROMETER

GOVERNMENT SUPPORT

This invention was made with Government support under Grant No. FA8702-15-D-0001 awarded by the U.S. Air Force. The Government has certain rights in the invention.

BACKGROUND

Hyperspectral imaging spectrometers have been utilized for a wide range of applications, including, but not limited to environmental monitoring, biomedical imaging, surveillance, food safety inspection and control, agricultural monitoring, and mineralogy. Both spaceborne and airborne hyperspectral imagers can provide critical data for a wide range of scientific, economic and national security needs. Despite the high expected value of Earth-scale spectral information, high cost and complexity has limited the number of fielded spaceborne hyperspectral imagers, making global, persistent coverage with rapid revisits infeasible.

SUMMARY

A computational imaging approach to hyperspectral imaging spectroscopy yields a spectrometer that can be miniaturized while maintaining high sensitivity. This type of spectrometer, called a Computational Reconfigurable Imaging SPectrometer (CRISP), does not require active components (unlike some other hyperspectral imaging solutions) and is compatible with a broad range of wavelengths. It uses a dual-disperser reimaging design, with a static coding mask in the image plane, and relies on platform motion or sensor scanning to achieve coding diversity.

In operation, an inventive spectrometer can make spatial-spectral coded measurements of a three-dimensional (3D) data cube on a two-dimensional (2D) detector array, which has fewer detector elements than the mask has resolvable features. Along-track platform or scan motion produces a time-modulated intensity pattern, which is sampled at the frame rate of the imager. The resulting frames are recovered by inverting a function defined by the mask pattern, from which the individual spectral images are extracted. This measurement approach provides significant radiometry advantages over traditional pushbroom spectrometers. These radiometric advantages grow as the format size of the focal plane array increases and are especially pronounced for detector-noise limited measurement systems, such as uncooled microbolometer arrays.

More fundamentally, inventive imaging spectrometry extends these radiometric advantages further by providing an advantage called "coding gain": As the along-track format size of the focal plane array grows beyond the minimum number of platform shifts needed to reconstruct the spatial/spectral data cube, the measurement becomes more overdetermined, and the SNR of the reconstructed spatial/spectral data cube continues to increase. The result is that the SNR can grow ever-larger in proportion the square root of the along-track focal plane array format size, for detector- and shot-noise-limited systems.

In addition, an inventive imaging spectrometer makes many measurements in parallel, so it realizes a multiplex advantage (Fellgett's advantage) that increases its SNR. Operating in the longwave infrared regime with noisy uncooled microbolometers further increases the impact of the multiplex advantage. The combined impact of the coding gain and the multiplex advantage results hyperspectral radiometric performance with an uncooled detector array that is competitive with conventional pushbroom imaging spectrometers with cooled detectors.

The inventive computational reconfigurable imaging spectrometers have other advantages as well. For example, they can make fully determined or overdetermined measurements instead of underdetermined measurements and can therefore operate without a priori knowledge of the scene being imaged. In addition, they use a dual-disperser configuration rather than a single-disperser configuration for pushbroom measurements, which relaxes the frame-to-frame alignment. And an inventive spectrometer can be used on a moving platform, such as a satellite or airplane. As a result, an inventive spectrometer doesn't require moving parts, whereas an imaging spectrometer for a microscope may need the spectrograph hardware to move relative to a stationary microscope objective.

In principle, any application which uses multi- or hyperspectral imaging can benefit from the potential for miniaturization offered by the inventive technology, particularly with the advent of small drones and satellites. For example, a weather-sensing or terrain-mapping satellite, drone, balloon, airplane, or helicopter could use a computational reconfigurable imaging spectrometer. An inventive spectrometer could be used for remote sensing of land from space or airborne vehicles are also domains where hyperspectral imaging has been applied. Chemical hazard or trace gas detection is another application of hyperspectral sensing that could benefit from CRISP. Biomedical imaging applications include tissue spectroscopy, microscopy, and frequency-domain optical coherence tomography. Wide-area surveillance instruments which scan to cover a wide field of regard can also use CRISP, and be used to secure buildings, airports, or other territories. Urban imaging (ground-based or airborne) for monitoring of power usage, pollutants, and trace gases is another application for the inventive technology.

An inventive spectrometer, also called a hyperspectral imaging system, may include a first dispersive element, a coding mask in optical communication with the first dispersive element, a second dispersive element in optical communication with the coding mask, and a detector array, such as an uncooled microbolometer array configured to detect long-wave infrared radiation, in optical communication with the second dispersive element and having m≥detector elements, where M and N are positive integers (e.g., M/N>10 or 100). In operation, the first dispersive element disperses an image moving laterally with respect to an optical axis of the hyperspectral imaging system into N spectral components. The coding mask encodes the N spectral components with a predetermined code, such as a binary Walsh-Hadamard S-matrix code or a random binary code. The second dispersive element recombines the N spectral components into an encoded image. And the detector array detects the encoded image. If desired, the coding mask can be reconfigured, e.g., to improve spatial and/or spectral resolution when reconstructing the laterally moving image from the laterally moving encoded image.

Such a system may also include a processor, operably coupled to the detector array, to form a reconstructed version of the image from the encoded image with a coding gain of $\sqrt{M/2N}$. If the image moves fast enough to cause motion blur in the reconstructed version of the image, the processor may estimate the motion blur from the reconstructed version of the image based on the predetermined code. The detector array can also acquire a sequence of encoded images as the image moves laterally with respect to the optical axis of the hyperspectral imaging system, in which case the processor can estimate a trajectory of the image with respect to the hyperspectral imaging system based on the sequence of encoded images.

The hyperspectral imaging system may also include a first lens in optical communication with the coding mask and at least one second lens in optical communication with the coding mask and the detector array. The first lens focuses the N spectral components onto the coding mask. And the second lens relays the encoded image to the detector array.

An inventive spectrometer can also be used to carry out inventive methods of hyperspectral imaging. An example of these inventive methods includes separating a moving image into N spectral components propagating orthogonal to a direction of motion of the moving image. A lens or other optical element focuses the N spectral components onto at least M spatially resolvable elements in a binary static mask, and the N spectral components are recombined to form an encoded moving image. A detector array, such as an uncooled bolometer array, samples at least M spatially resolvable spots of the encoded moving image at a frame rate f to form a hyperspectral data cube. And a processor forms a reconstruction of the moving image with a coding gain of $\sqrt{M/2N}$ based on the hyperspectral data cube.

The binary static mask may apply a predetermined code to data in the hyperspectral data cube represented by a measurement matrix $\varphi$, in which cases the processor forms the reconstruction of the moving image by estimating spectra of the moving image with a pseudoinverse $\varphi^+$ of the measurement matrix. To estimate the spectra, the processor may minimize a mean squared error (MSE) equal to $(\sigma^2/M)\text{Trace}(\varphi^+\varphi)^{-1}$, where $\sigma^2$ represents a variance of measurement noise associated with sampling the at least M spatially resolvable spots of the encoded moving image.

Such a method may also include resolving motion of the moving image during a frame integration period $T=1/f$ based on at least a portion of the hyperspectral data cube. In this case, the spectrometer may compensate the motion of the moving image during the frame integration period $T=1/f$ in the reconstruction of the moving image. The processor can also estimate a trajectory of the moving image based on at least a portion of the hyperspectral data cube.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 6A shows an image of a 100° C. blackbody (CI-Systems SR-800) acquired with a computational reconfigurable imaging spectrometer (the arrow indicates direction of motion of the scene).

FIG. 6B is a plot of raw blackbody spectra for blackbodies at 40° C., 100° C., and 138° C. (100-pixel by 100-pixel averages) acquired with a computational reconfigurable imaging spectrometer.

FIG. 6C is shows the blackbody spectra of FIG. 6B adjusted for focal plane array wavelength sensitivity (the solid lines represent theoretically calculated blackbody curves (Planck's law) for each temperature).

FIG. 6D shows blackbody spectra as seen through 7.90 μm and 10.27 μm Spectrogon narrow bandpass filters with a computational reconfigurable imaging spectrometer (solid black lines represent filter transmission data provided by the vendor).

Figure 8A:
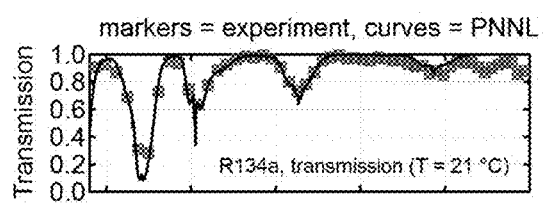
FIG. 8A is a transmission spectrum of about 2000 ppm of R-134a gas at 21° C. (room temperature) acquired with a computational reconfigurable imaging spectrometer.
Figure 8B:
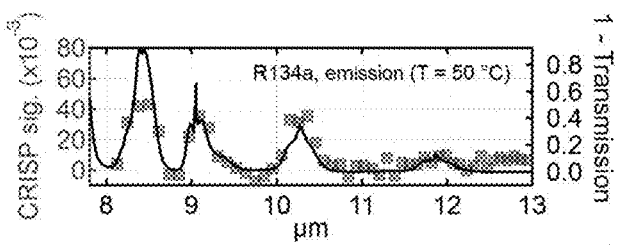
FIG. 8B is an emission spectrum (left axis) and (1−Transmission) (right axis) of about 2000 ppm of R-134a gas at 50° C. acquired with a computational reconfigurable imaging spectrometer.
Figure 8C:
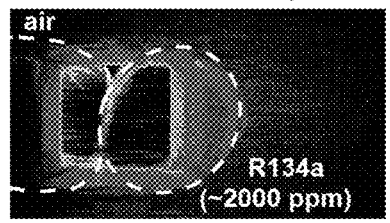
Figure 8D:
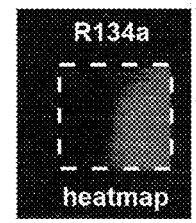

FIG. 8C shows an image acquired with a computational reconfigurable imaging spectrometer of two polyethylene bags, one filled with air and one that contains 2000 ppm of R-134a gas mixed with air, placed side-by-side in front of a 100° C. blackbody FIG. 8D shows a heat map of the R-134a signal (depth of the A=8.4 μm transmission line) in FIG. 8C, with a white dotted line depicting the outline of the blackbody source.

Figure 9:
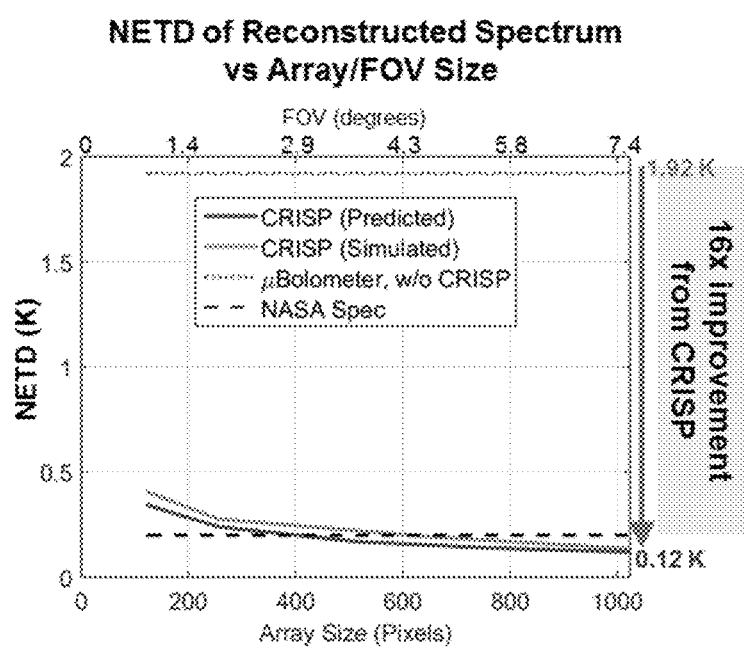

FIG. 9 is a plot of the noise-equivalent temperature difference (NETD) of reconstructed spectra versus array/field-of-view size for predicted and simulated computational reconfigurable imaging spectrometers, for a spectrometer with an uncooled microbolometer detector array, and for NASA specifications.

DETAILED DESCRIPTION

A Computational Reconfigurable Imaging Spectrometer

Figure 1A:
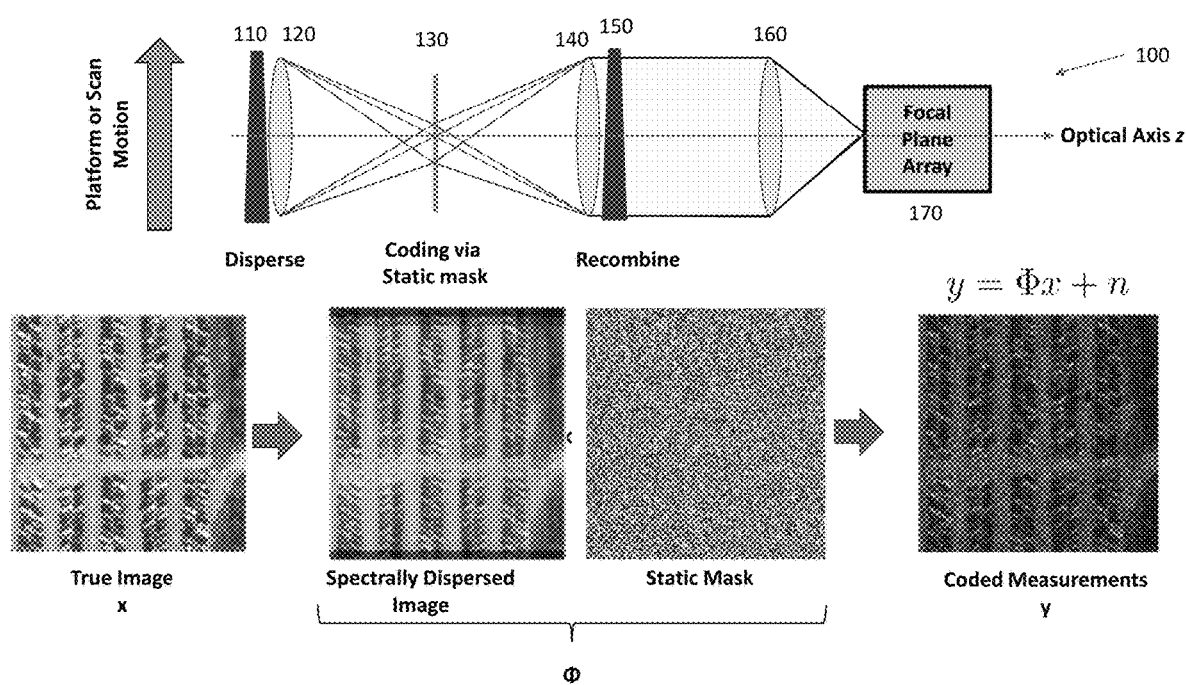
FIG. 1A shows a computational reconfigurable imaging spectrometer dispersing and encoding true images x with a static mask to form coded measurements.
Figure 1B:
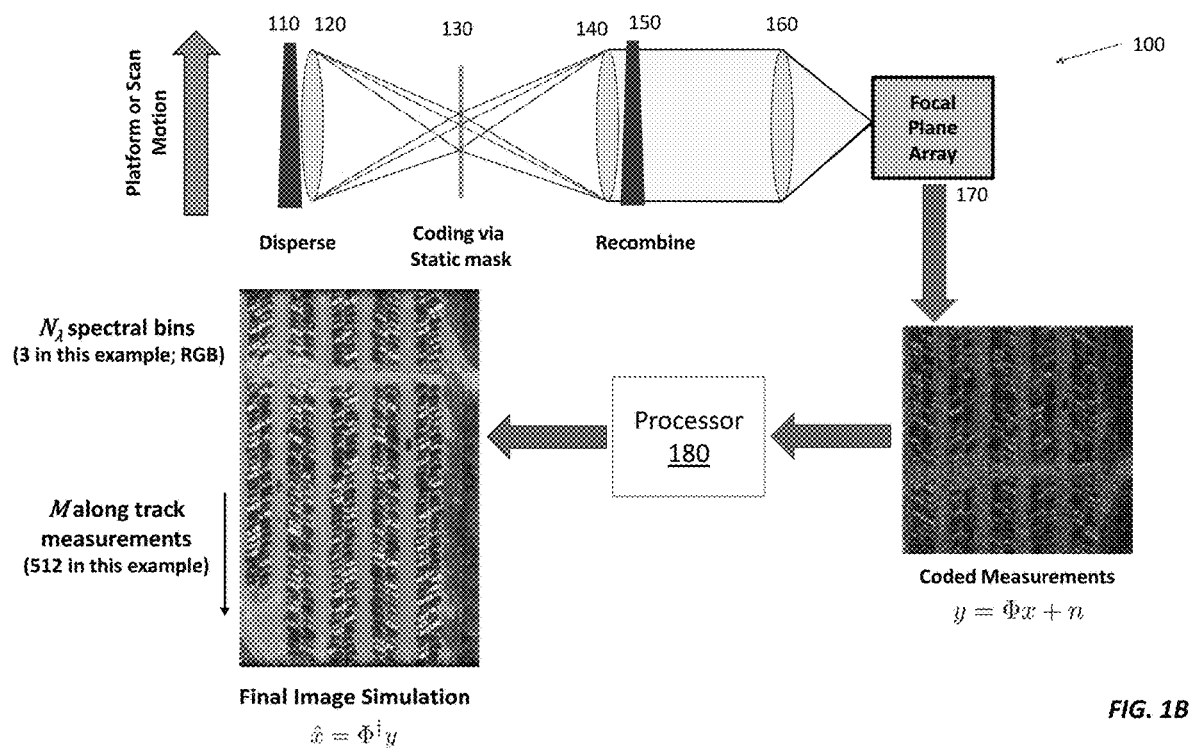
FIG. 1B shows decoding of the coded measurements acquired with a computational reconfigurable imaging spectrometer to produce a final image.

FIGS. 1A and 1B show a computational reconfigurable imaging spectrometer 100 that exploits platform motion, dispersive elements 110 and 150, and a reconfigurable coded focal-plane mask 130 to make a time series of encoded measurements of the optical spectrum at each pixel in a focal plane array 170. This encoding is inverted using specialized processing to recover the spectrum. As described below, this approach has sensitivity and other advantages over existing imaging spectrometer designs, enabling miniaturization and improved area coverage.

The first dispersive element 110 is a prism, grating, or other optical element that spectrally disperses light from a scene x. The minimum resolvable spectral feature is limited by the product of the spatial point spread function extent in distance on the mask 130 and the change in wavelength per unit distance due to dispersion. Ultimately, the number of spectral unknowns should not be bigger than the number of imager rows, and the amount of spectral spread for the spectral bins should not be larger than the focal plane array 170.

The spectral dispersion can be performed by the first dispersive element 110 in the along-track dimension or cross-track dimension (i.e., in the same direction as the scene motion or orthogonal to the direction of scene motion and the spectrometer's optical axis z), with a suitable choice of coding mask 130. A first lens 120 creates a dispersed image of the scene on the mask 130, which encodes the dispersed image with a known pattern. The second dispersive element 140 (e.g., another prism or grating) recombines the dispersed light, and a telescope formed of lenses 140 and 160 images the encoded, dispersed image 1 onto the focal plane array 170, which has fewer pixels (detector elements) than the mask. The focal plane array 170 samples the resulting 2D radiance field, which contains light summed from the whole spectrum, but with a position-dependent weighting as a function of wavelength to create coded measurements y.

Platform motion or scanning in a direction orthogonal to the spectrometer's optical axis z causes the scene to move relative to the mask 130 and the focal plane array 170. Nominally, the frame rate is equal to the time of flight over the instantaneous field of view of a single row of pixels in the focal plane array 170, but other scenarios are possible. This produces a time modulated intensity pattern which is sampled at the frame rate of the focal plane array 170. The spectrometer's spatial and spectral characteristics are reconfigurable, simply by swapping or changing the mask 130, for example, with a wheel or translation stage. The mask 130 itself can be static, so the spectrometer 100 does not require any active components.

The spectrometer 100 can operate over a broad range of wavelengths, limited primarily by the responsivity of the focal plane array 170. If the focal plane array 170 is an uncooled (micro)bolometer array, for instance, the spectrometer 100 may operate in the long-wave infrared (LWIR) region of the electromagnetic spectrum (i.e., a wavelength range of about 8-14 microns). And if the focal plane array 170 is a CCD or CMOS array, the spectrometer 100 may operate in the visible or near-infrared (NIR) regions of the visible spectrum.

Processing Coded Measurements

Figure 1C:
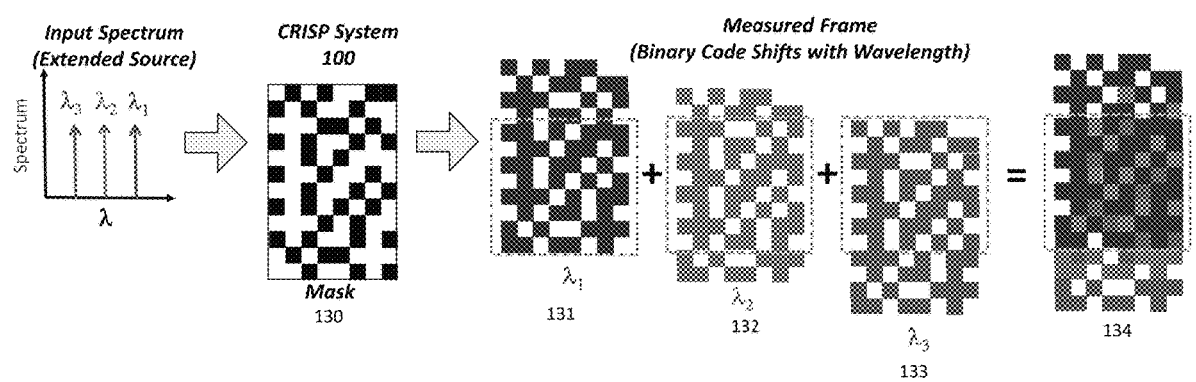
FIG. 1C illustrates how a computational reconfigurable imaging spectrometer measures the binary code of the mask shifted as a function of wavelength.
Figure 1D:
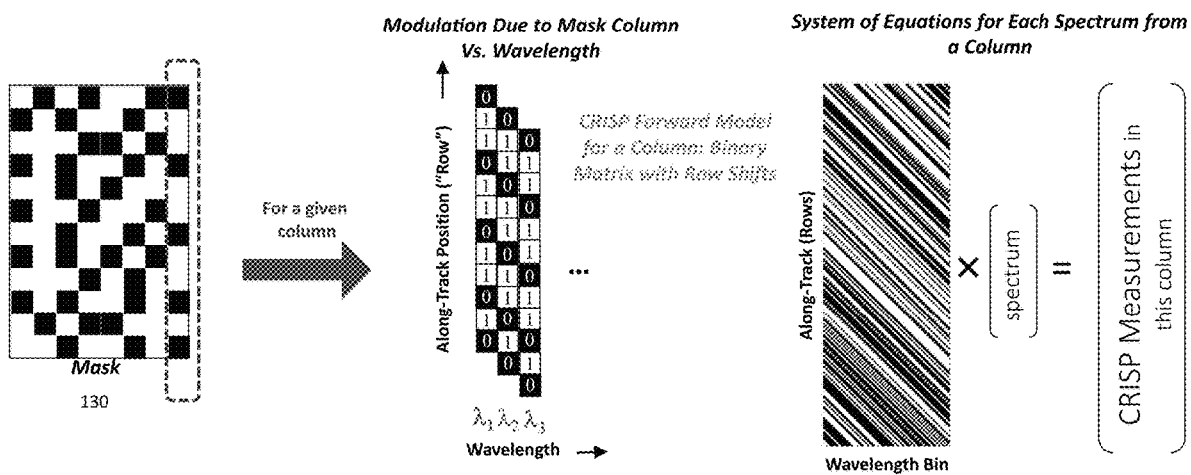
FIG. 1D illustrates how a single column of the binary mask in a computational reconfigurable imaging spectrometer contributes to the final image acquired by a computational reconfigurable imaging spectrometer.

FIGS. 1C and 1D illustrate how the spectrometer 100 of FIGS. 1A and 1B modulates the spectrum with a binary code from the mask 130. FIG. 1C shows that code is shifted as a function of wavelength. For three wavelength bins $\lambda_1$, $\lambda_2$, and $\lambda_3$, there are three coded images 131,132, and 133, respectively, each shifted vertically with respect to the other coded images. A superposition 134 of these coded images 131-134 is recombined by the second dispersive element 150 and sensed by the focal plane array 170.

FIG. 1D shows that in an along-track measurement, wavelength-shifted modulation combined with along-track platform motion leads to a system of equations constructed from the mask' features. At left in FIG. 1D, one column of the binary mask yields vertically shifted measurements as in FIG. 1C. Along-track motion converts this code into a "known measurement matrix $\varphi$," which, when multiplied by the spatial/spectral data cube x yields the CRISP coded measurement y.

In practice, the coded measurements $y=\varphi x+n$ produced by the computational reconfigurable imaging spectrometer 100 represent a 3D spatial/spectral data cube x encoded with the known measurement matrix $\varphi$ and noise n. With a well-designed mask (for example, a mask encoded with a binary Walsh-Hadamard S-matrix code), the measurement matrix $\varphi$ is well-determined or overdetermined. The Walsh-Hadamard S-matrix code is an optimal encoding in principle but in practice can lack robustness if, for example, the number of measurements is not a power of 2 (minus one) or if there is deviation from perfect binary modulation, grid alignment, and rectilinear motion.

Other types of masks also work, including masks encoded with random binary codes. If the measurement is sufficiently overdetermined, the performance difference between a binary Walsh Hadamard S-matrix mask and a random binary matrix narrows and becomes small as explained below.

A processor 180 (FIG. 1B) coupled to focal plane array 170 uses the pseudoinverse of the measurement matrix, $\varphi^+$, to compute a reconstructed data cube $\hat{x}$, also shown in FIG. 1B. The reconstructed data cube, or spectra, $\hat{x}$, minimize the mean squared errors between the measurements and the measurements generated by the estimate based on the forward matrix model φ. The forward matrix model is derived from the code used in the binary mask.

The processor 180 can perform the reconstruction efficiently, in part by exploiting repetitive and cyclic patterns within the forward matrix model φ and/or S-matrix orthogonality to reduce computation time. More specifically, the S-matrix is derived from an orthonormal matrix (with scale and offset), so its inverse is straightforward to compute. In general, the spectra in a given column of the spectral data cube are modulated by the same column of the mask, so each column of the spectral data cube has its own M×N system matrix φ. Thus, for each column of the spatial data cube, the processor computes a single pseudoinverse $\varphi^+$ and uses it to solve every spectrum in that column.

In practice, the spectrometer 100 measures an image of the mask under monochromatic light before (or during or after) the scene measurement. This measured image of the mask is then used to determine how the spectrometer 100 actually encodes the image, and this assumption is used in processing. Use of the measured image of the mask in the processing, rather than the assumed "as designed" binary mask, is more robust because it accounts for the point spread, aberrations, distortions, and actual mask (mis)alignment relative to the pixel grid. In addition, the real "as-measured" mask may not be perfectly binary but may include some gray-scale features due to the real effects.

The Reconfigurable Binary Mask

The number of features or pixels in the mask can be larger or smaller than the number of pixels in the focal plane array, with corresponding tradeoffs. Masks with more features ("pixels") than detector elements in the focal plane array can enable increased spatial and spectral resolution. Masks with fewer features reduce resolution but enable higher signal-to-noise ratio measurements over a more coarsely sampled grid. Without exploiting knowledge of the signal structure, the number of frames F times the number of pixels P should be greater than or equal to NP. Compressive reconstruction techniques enable spectral recovery when FP<NP by taking advantage of signal structure. Put differently, F=N yields a fully determined measurement, F>N yields an overdetermined measurement, and F<N yields an underdetermined (compressive) measurement. In practice, the compressive case can be accomplished by minimizing the residuals on the measurements while minimizing a data regularization term such as the Frobenius norm of the recovered spectral matrix x (a low rank prior). Such a minimization can be carried out in many ways, including via the alternating direction method of multipliers (ADMM) method.

A good nominal operating point (though not the only operating point) is to match the number of mask features in the mask 130 to the number of detectors in the focal plane array 170 plus the number of wavelength bins minus 1. For example, if the focal plane array 170 in FIGS. 1A and 1B has a 1024×1024 array of detector elements (i.e., it is a 1-megapixel focal plane array) and the first dispersive element 110 separates incident light into 128 wavelength bins, the mask 130 may have (1024+127)×1024=1,178,624 resolvable features.

If desired, the mask can be reconfigured between measurements. That is, the mask can be replaced, translated laterally, rotated, or changed between measurements. Shifting or rotating the mask or replacing the mask with a different mask causes the computational reconfigurable imaging spectrometer to modulate spectral data cube with a different code. A different code may be advantageous for a number of reasons. By swapping the mask with a different one, the spectrometer can be reconfigured for optimal performance at different spectral or spatial resolutions.

Consider spectral resolution. In a nominal CRISP system, the imager (focal plane array) has M rows of detector elements (pixels), the spectrum is divided into N spectral bins, and the mask contains M+N−1 rows of features. If the system doesn't need to operate with its full spectral resolution, the spectrum can be divided into coarser bins (e.g., into N/2, N/4, or N/5 spectral bins), with each bin treated as an unknown to be reconstructed. In that case, models suggest that a mask which has coarser spatial features (e.g., 2, 4, or 5 times the width of the detector element) can encode the coarser spectrum such that it can be recovered with lower mean square error.

Figure 2A:
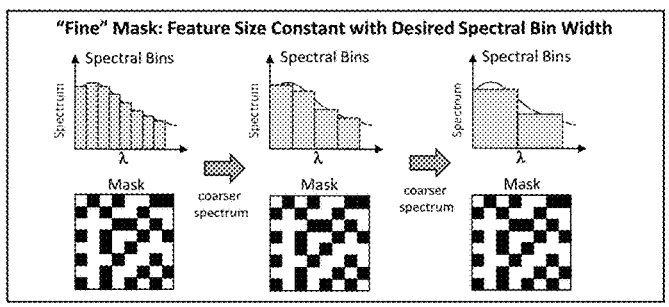
FIG. 2A shows different "fine" binary masks whose feature sizes remain constant with spectral bin width.
Figure 2B:
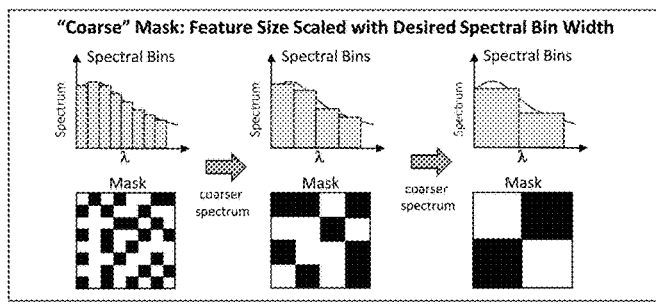
FIG. 2B shows different "coarse" binary masks whose feature sizes scale with spectral bin width.

FIGS. 2A and 2B show different mask options. In FIG. 2A, the mask has fine features whose sizes remain constant while the wavelength bins grow wider. In FIG. 2B, the mask has coarse features whose sizes scale with the wavelength bin width. Without being bound by any particular theory, spatial masks with finer spatial features may be better for reconstructing data at subpixel spatial or finer-than-a-bin spectral resolutions, while spatial masks with coarser spectral features may be better optimal for reconstructing data at coarser-than-a-bin spectral resolutions.

Put differently, the mask's predetermined code may be selected to improve reconstructions at high spatial resolution (e.g., finer than a pixel) or low spatial resolution (e.g., coarser than a pixel) relative to the other mask options. Alternatively, or in addition, the mask's predetermined code may enable improved reconstructions at high spectral resolution (e.g., finer spectral bins than the usual N spectral bins) or low spectral resolution (e.g., coarser spectral bins than the usual N spectral bins). A mask may also have spatial features of different sizes (e.g., smaller than an imager pixel or larger than an imager pixel) in the direction parallel to dispersion.

Figure 2C:
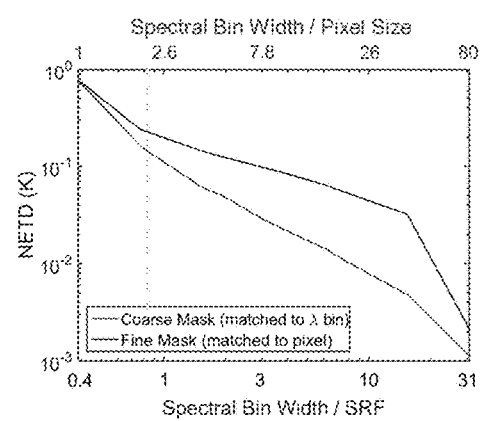
FIG. 2C is a plot of noise equivalent temperature difference (NETD) versus spectral bin width for the fine binary masks of FIG. 2A (upper trace) and the coarse binary masks of FIG. 2B (lower trace).

FIG. 2C is a plot of the noise equivalent temperature difference (NETD) versus spectral bin width for binary masks with fine features (upper trace) and coarse features (lower trace) with the same optics. (The upper axis shows spectral bin width normalized to pixel size and the It shows that, for the same optics, varying the mask feature size improves performance for recovering a coarser spectrum. The upper trace was derived by using a single static mask (e.g., as in FIG. 2A), solving for the spectrum with N bins, and spectrally averaging and downsampling to get the spectrum at successively coarser spectral bin sizes. The lower trace was derived by using a reconfigurable mask with coarser spatial features (e.g., as in FIG. 2B) and solving for the successively coarser spectral bins directly. The performance, shown as NETD, is better with the reconfigurable mask.

Super-Resolution Imaging

Choosing the mask features to be sub-pixel in size enables digital super resolution for systems that are not diffraction limited. A mask with features smaller than a detector pixel will encode the spectral cube with fine temporal resolution, and thus enable reconstruction of the spatial data cube at subpixel spatial resolutions. The spatio-spectral modulation encodes information that enables recovery of spectrum at a subpixel resolution. As mentioned above, the point spread function (PSF) can be larger than a focal plane array pixel, even if mask feature is same size as focal plane array pixel. In some circumstances, the PSF may limit spatial and spectral resolution.

Sensitivity Enhancement

A computational reconfigurable imaging spectrometer can be more sensitive than other imaging spectrometers, leading to improvements in area coverage rates and allowing for lower-size/weight/power instruments to achieve the same SNR as other imaging spectrometers. The CRISP approach for hyperspectral imaging enables two sensitivity gains, the Fellgett or multiplex advantage found in other multiplexed measurement (e.g., Hadamard spectrometer) designs and a "coding gain." These gains can be obtained simultaneously in practical designs and applications.

The sensitivity enhancement can be engineered by increasing the number of along-track measurements (hence imager rows), for background- and dark-noise limited spectrometers. To see how, consider a spectrometer with $N_\lambda$ wavelength bins that makes M along-track measurements, where $M \geq N_\lambda$. By combining the signals from multiple spectral bins in each measurement, CRISP gains a multiplex sensitivity advantage (Fellgett's advantage) in SNR in the case where signal-independent detector noise is dominant. For an S-matrix mask, where close to half of all spectral bins are combined in each measurement, the SNR gain is $\sqrt{N_\lambda}/2$ relative to a dispersive slit spectrometer that measures the signal in each spectral bin separately.

Here, SNR is defined as average signal intensity over the signal reconstruction error standard deviation. The expected mean squared error for such a system is $MSE = (\sigma^2/M) \text{Trace} (\varphi^T \varphi)^{-1}$ when the measurement noise is Gaussian with variance $\sigma^2$. The multiplex advantage result is obtained when $M = N_\lambda$ and the measurement matrix $\varphi$ is an S-matrix.

For many practical applications, including atmosphere sounding, the number of wavelengths of interest $N_\lambda$ can be exceeded by the number of measurements M in part due to the format and frame rates achieved by modern focal plane arrays. For the case when $M > N_\lambda$, an additional coding gain of $\sqrt{M/N_\lambda}$ is achievable. To see this, consider the case when $M/N_\lambda$ is an integer and the measurement matrix consists of multiple vertically concatenated S-matrices, i.e., $$\varphi = \begin{bmatrix} S_1 \\ \vdots \\ S_{M/N_\lambda} \end{bmatrix}.$$

As shown below, this gain can also be obtained for M sufficiently larger than $N_\lambda$ using random binary matrices. For detector-noise (dark-noise) limited measurements, the multiplex and coding gains can be obtained simultaneously, resulting in an SNR enhancement for CRISP versus dispersive slit designs of $\sqrt{M}/2$. This combined sensitivity gain enables sensitive measurements using lower performance detectors such as uncooled microbolometers. Under shot-noise limited conditions, SNR enhancement relative to existing FTIR and dispersive slit spectrometers is possible as well via the coding gain.

Under background-limited conditions, SNR enhancement relative to existing Fourier-transform infrared (FTIR) and dispersive spectrometers is possible as well. Specifically, if $M > N_\lambda$ then the reconstruction problem is overdetermined, and SNR is enhanced by a factor called the coding gain, $\sqrt{M/2N_\lambda}$. FTIR and dispersive spectrometer types can produce coding gain only with prohibitive difficulty, such as replicating large portions of the instrument to get an overdetermined system like CRISP.

FTIR systems possess a Fellgett advantage of $\sqrt{N_\lambda}/(4\sqrt{2})$ over dispersive systems when dark-noise limited. However, this advantage is less than that of CRISP by a factor of 2.8 $\sqrt{M/N_\lambda}$ due to losses and inefficiencies resulting from the beam splitter, cosine modulation, and symmetric interferograms. In addition, imaging FTIR spectrometers typically require complex moving parts. They must also sweep through collection of the entire interferogram before the scene shifts out of view, which becomes impractical on a moving platform without mounting the spectrometer or imaging optics on a gimbal.

A variable-gap etalon spectrometer has about twice the loss of an FTIR spectrometer, giving it an SNR that is at least about 5.6 times smaller than the SNR of a computational reconfigurable imaging spectrometer. It also has limitations on spectral resolution and spectral coverage versus CRISP.

Noting these SNR gains, a computational reconfigurable imaging spectrometer has several advantages over existing technologies, including conventional dispersive spectrometers and FTIR spectrometers. With a well-designed coding mask and suitable estimation algorithm, a computational reconfigurable imaging spectrometer can achieve both a multiplex (Fellgett) gain and a coding gain, improving the system SNR beyond what is possible via alternative architectures assuming a sufficiently large focal plane array. The coding gain enables SNR improvements even under shot-noise limited imaging conditions, under which traditional multiplexed spectral imaging architectures can at best offer no loss relative to non-multiplexed designs. A computational reconfigurable imaging spectrometer therefore provides a sensitivity gain in both shot-noise limited and detector-noise limited cases compared to existing technologies.

Additionally, a computational reconfigurable imaging spectrometer does not require moving parts. These advantages translate directly into reduced size, weight, and power (SWaP) requirements, as expensive cooling components can be either be reduced or eliminated, and compact optical designs may be used. In addition to the sensitivity and SWaP advantages, a computational reconfigurable imaging spectrometer can be reconfigured by swapping or changing the coding mask mid-mission. A computational reconfigurable imaging spectrometer sensitivity gains can yield improvements in area coverage rates and allow for smaller, lighter, more efficient instruments with the same SNR as existing systems.

Motion Compensation Using Computer Vision on the Collected Samples

As explained above, the computational reconfigurable imaging spectrometer 100 produces a raw product (the coded measurement y) that includes (a) scene imagery x and (b) fixed pattern imprinting from the mask features. This raw image product contains direct 2D scene imagery enables the use of computer-vision motion tracking to remove jitter and nonlinear motion. This is in direct contrast to other hyperspectral imaging modalities. Pushbroom system do not produce 2D images, making any form of computer-vision motion tracking very difficult or impossible. Michelson systems produce interferograms again making motion tracking very difficult.

The ability to register one frame to the next when measuring scenery from a moving platform is highly advantageous not just for hyperspectral imagers but for imaging systems in general. Since each CRISP frame constitutes a complete x-y image (in contrast to pushbroom spectrometry, where each frame is a single spatial column with the orthogonal axis being spectral wavelength), the cross-correlation between successive frames can be used to provide registration and remove motion artifacts due to camera motion caused by movement of its platform. Such platform motion can be especially detrimental to any technique that creates a final image product from consecutive frames (e.g. FTIR-based spectrometers or CRISP spectrometers).

Figure 3A:
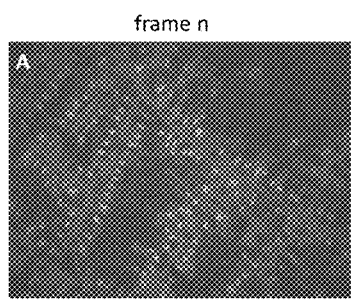
FIG. 3A shows a first composite image of the ground acquired by a computational reconfigurable imaging spectrometer aboard an airplane.
Figure 3B:
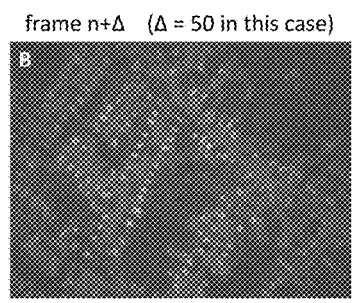
FIG. 3B is a second composite image of the ground acquired by a computational reconfigurable imaging spectrometer aboard an airplane.
Figure 3C:
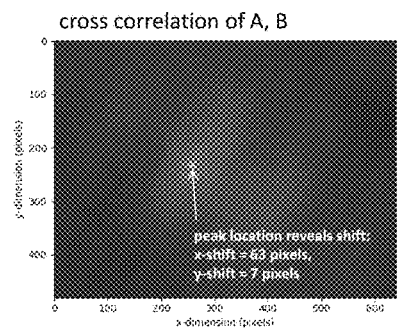
FIG. 3C is a cross-correlation of the first composite image of FIG. 3A and the second composite image of FIG. 3B.
Figure 3D:
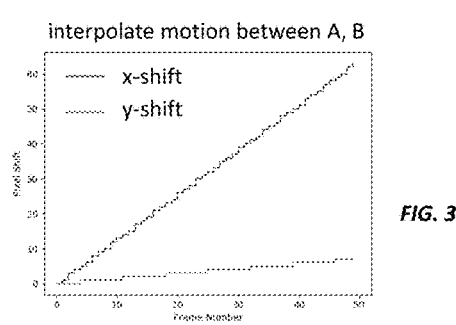
FIG. 3D is a plot of pixel shift versus frame number for the derived from cross-correlations like those in FIG. 3C for x motion (upper trace) and y motion (lower trace).

FIGS. 3A-3D illustrates actual motion compensation used in a flight test of the CRISP system. FIGS. 3A and 3B show complete x-y images of the ground taken with an airborne CRISP system. The image in FIG. 3B was acquired 50 frames after the image in FIG. 3A. FIG. 3C shows the cross-correlation between the images in FIGS. 3A and 3B. FIG. 3D is a plot of the location of the cross-correlation peak for cross-correlation functions repeated for many successive frames. It represents the relative motion track of the scene. This track of the scene is used to register the acquired frames to a common reference, thereby removing motion artifacts.

Motion Deblurring

In traditional imaging system design, integration time is limited by the rate of scene or sensor motion relative to angular resolution. If the integration time is too long, the scene will blur, and high-frequency information will be irretrievably lost. A computational reconfigurable imaging spectrometer does not suffer from this limitation due to the encoding mask. In a computational reconfigurable imaging spectrometer, if the integration time is long relative to the ratio of angular resolution to scene or platform motion, the scene will blur as in traditional systems, but this blur will be modulated by the encoding mask. The blur modulation may vary from frame to frame, enabling the recovery of high-frequency spatial and spectral information through processing that inverts a forward matrix model that models the effect of blur on the spatially encoded, dispersed image. FIGS. 1A and 1B show a simulated example of this mode of operation. The implication of this capability is that the CRISP system can be used to image fast moving scenes or on sensor platforms moving at high rates, substantially expanding its scope of utility.

To improve motion deblurring, a digital focal plane could be used to enhance deblurring. The method for doing this is to change the gain in the detector during the blurring and to vary the gains chosen across blur measurements. This ability to modulate the blur functions enriches the types of encoding that can be achieved and can yield superior reconstruction quality.

Motion deblurring works by design—the modulation of the blur function encodes the high frequency information that would otherwise be lost in the low pass filter of the blur function. Essentially, this is a spreading code that is applied to the signal prior to the blur, thus ensuring that high frequency information gets mapped into the low frequency region admitted by the motion blur. Given this design, the relationship between the unknown 3D spatial/spectral data cube x and the measurements y can be modeled via a linear function. The size of the vector y is the number of pixels times the number of frames. The unknown 3D spatial/spectral data cube has a size equal to the number of detector elements by number of wavelength bins. This is can be solved by computing a matrix pseudoinverse, though in practice, due to the large size of the problem an approximate method, such as least squares QR (LSQR), or a parallelizable method, such as ADMM, may be applied to obtain a solution to this matrix equation.

Calibrated Blackbody Measurements

Figure 4A:
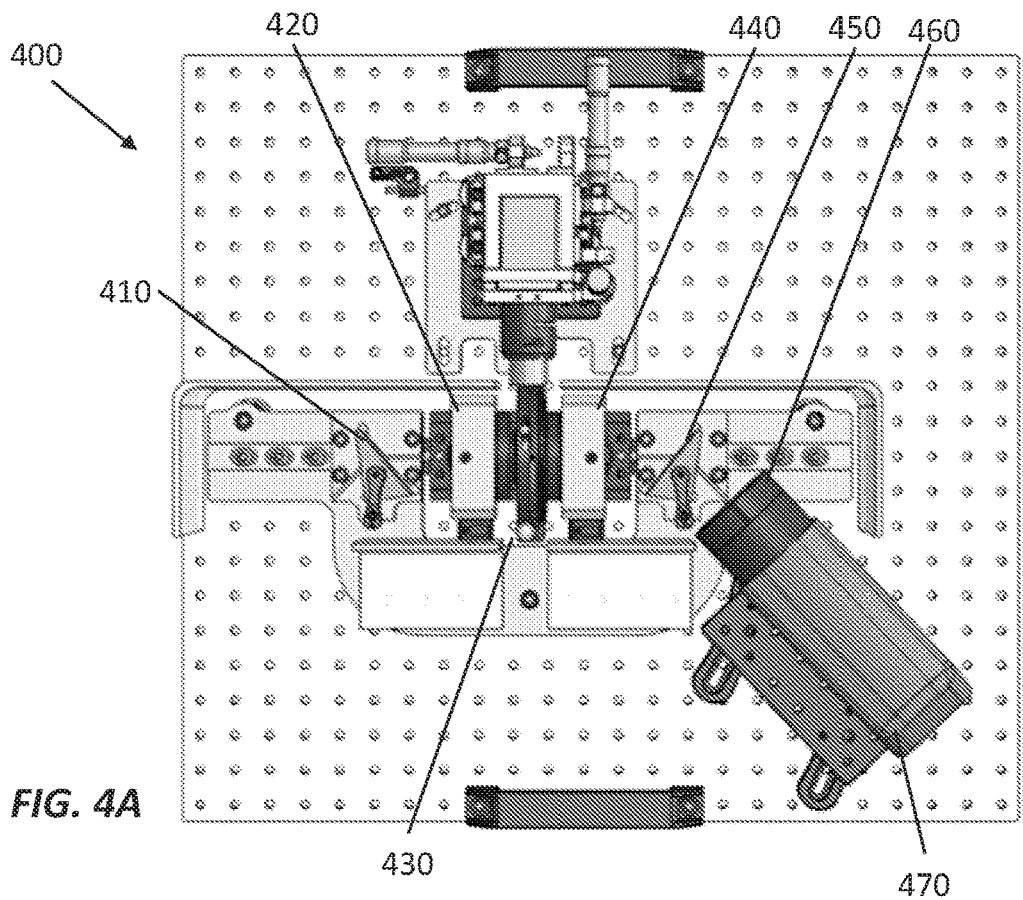
FIG. 4A shows a schematic of a computational reconfigurable imaging spectrometer built on an optical breadboard.
Figure 4B:
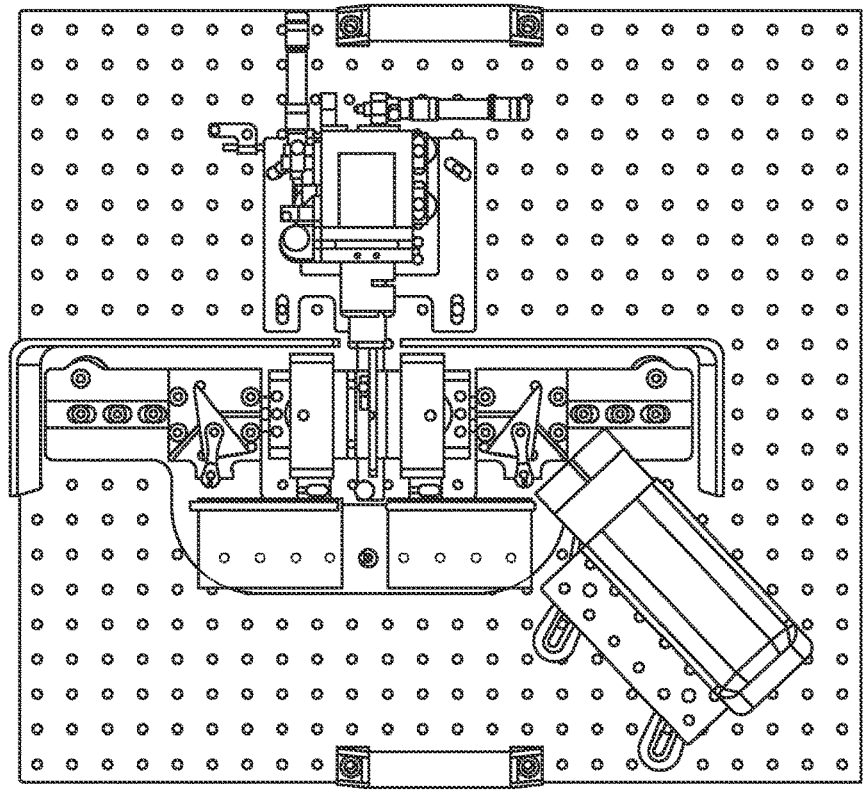
FIG. 4B shows a photograph of the computational reconfigurable imaging spectrometer shown in FIG. 4A.

FIGS. 4A and 4B show a schematic and a photograph, respectively, of a computational reconfigurable imaging spectrometer 400 built using commercial off-the-shelf (COTS) components. The spectrometers 400 was built for concept demonstration and thus has not been optimized for optical throughput. It operates in the longwave infrared (LWIR) regime using an uncooled microbolometer camera 470 (significantly noisier than state-of-the-art HgCdTe detectors) because a detector-noise limited system best shows its advantages.

In operation, a first ZnSe dispersive prism 410 (without antireflective coating) separates light into different wavelength bins. The optical design of the spectrometer 400 yields $N_\lambda=67$ spectral bins across a wavelength band of 7.7-14 µm, giving a spectral resolution of $\Delta\lambda\approx94$ nm in the plane of the mask 430.

A first 52 mm, f/1 lens 420 (aspheric triplets; FLIR model A655sc) focuses the dispersed light onto an antireflective coated ZnSe coding mask 430 with a random checkerboard pattern applied using contact lithography. The feature sizes of the coding mask 430 are matched to the pixel size of the imager 470. A second 52 mm, f/1 lens 440 and a second ZnSe dispersive prism 450 form a spectrally combined, encoded image that is sampled by the microbolometer camera 470 at 50 frames per second (fps) with an array of 640×480 pixels, each of with is 17 µm square. At 17 µm, the pixels of the imager 470 and the coding mask 430 are smaller than the diffraction-limited point spread function (PSF) in the LWIR, which is about 20-34 µm.

Figure 5A:
FIG. 5A shows a randomly coded binary mask suitable for use in a computational reconfigurable imaging spectrometer.
Figure 5B:
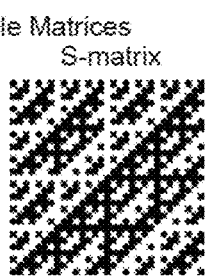
FIG. 5B shows a binary mask encoded with a Hadamard S-matrix suitable for use in a computational reconfigurable imaging spectrometer.

FIG. 5A shows a random checkerboard pattern like the one applied to the mask 430. FIG. 5B shows a better-designed mask—in this case, a binary Hadamard S-matrix. The mask "truth" (i.e., a picture of the mask used to decode the hyperspectral data cube) can be experimentally determined by peering into an integrating sphere illuminated by a single longitudinal mode quantum cascade laser emitting light at $\lambda=8.85$ µm with the spectrometer 400. Because the PSF is larger than the pixel size, the mask truth may appear gray instead of perfectly binary (black and white).

Figure 5C:
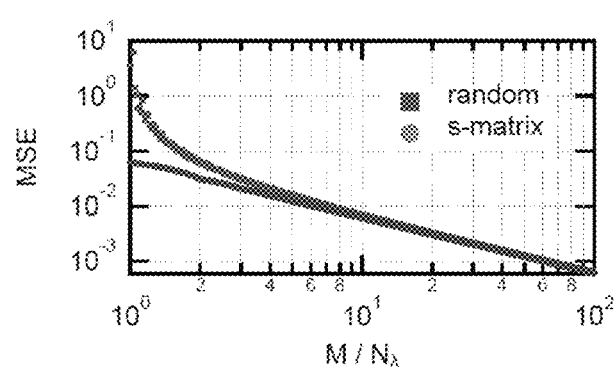
FIG. 5C is a plot of simulated mean squared error (MSE) versus level of determination $(M/N_\lambda)$ of a computational reconfigurable imaging spectrometer measurement using the randomly patterned coding mask of FIG. 5A versus the more efficient S-matrix (Hadamard) coding mask of FIG. 5B.

FIG. 5C is a plot of expected mean squared error (MSE) versus the ratio of number of measurements to number of wavelength bins ($M/N_\lambda$) for the randomly patterned mask (upper trace) shown in FIG. 5A and Hadamard S-matrix mask (lower trace) shown in FIG. 5B. It shows that a randomly patterned mask's performance nearly matches the performance of the S-matrix mask once a measurement has become overdetermined by a factor of about three to five. This result was obtained through several simulations of the expected mean squared error (MSE) for a given mask weighing design φ, which can be calculated as $MSE=(\sigma^2/M)Trace(\varphi^T \varphi)^{-1}$. Without being bound to any particular theory, this may occur because a fixed number of randomly chosen vectors (columns of the measurement matrix) are more likely to be well separated as the dimension of the vector space increases.

FIGS. 6A-6D show spectral measurements of an extended source blackbody (CI-Systems SR-800) acquired with the computation reconfigurable imaging spectrometer 400 of FIGS. 4A and 4B. FIG. 6A shows a single frame of the calibrated blackbody source at 100° C. imaged through the spectrometer 400. For these experiments, the blackbody source was positioned about 3 m from the spectrometer 400 and translated via a motorized translation stage to simulate platform motion (the white arrow in FIG. 6A indicates the direction of motion). The velocity of the translation stage was set so that the blackbody source moved at a rate of v=(1 sample distance)·(frame rate). The spectrometer 400 captured a total of 335 frames of the blackbody source moving across the image plane, making the dataset overdetermined by a factor of five.

FIG. 6B shows the resultant raw spectra (after decoding the dataset) of the calibrated blackbody source at 40° C., 100° C., and 138° C. After adjusting for the wavelength specific sensitivity of the microbolometer 470, the resulting spectral shape matches perfectly to blackbody radiation theory (solid black lines), as shown in FIG. 6C.

FIG. 6C shows spectra of a pair of narrow bandpass filters (Spectrogon Inc.) between the spectrometer 400 and the blackbody source. The filters had center wavelengths of 7.90 µm and 10.27 µm. The resulting spectral shapes agree well with the filter transmission data (black lines) provided by the vendor.

The spectra shown in FIGS. 6B-6D were obtained by subtracting a background measurement (in this case, a measurement with the spectrometer input blocked) from the raw spectra. This background subtraction helps to reduce or eliminate trends in the baseline or any clutter in the spectrum due to *narcissus* or other effects.

A Computational Reconfigurable Imaging Spectrometer Vs. A Pushbroom Spectrometer As mentioned above, an advantage of computational reconfigurable imaging spectrometers is that the coding gains enable enhanced sensitivity for both shot-noise limited and detector-noise limited systems. These gains become apparent when comparing the performance of a computational reconfigurable imaging spectrometer to the performance of a pushbroom spectrometer. In this comparison, the pushbroom spectrometer is the spectrometer 400 in FIGS. 4A and 4B reconfigured for pushbroom operation, i.e., with the first prism 410 replaced with an uncoated ZnSe window of similar size (to keep the optical throughput consistent) and the coding mask 430 replaced with a slit whose width is matched to the pixel size of the imager 470. Both configurations were used to image the same 40° C. and 138° C. blackbody sources.

Figure 7:
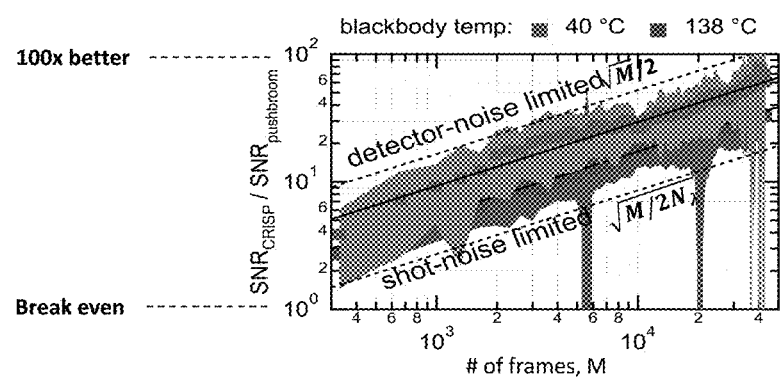
FIG. 7 is a surface plot of the ratio of the signal-to-noise ratio (SNR) for a computational reconfigurable imaging spectrometer to the SNR of a pushbroom spectrometer with the same lenses and focal plane array versus number of image frames for blackbodies at 40° C. (upper trace) and 138° C. (lower trace).

FIG. 7 shows the ratio of SNRs of the spectrometer 400 ($SNR_{CRISP}$) compared to same spectrometer reconfigured to operate as a pushbroom spectrometer ($SNR_{pushbroom}$) versus number of measurements (frames) M for the CRISP measurements (the pushbroom measurements are single-shot measurements). The CRISP SNR gains grow as $\sqrt{M}$ (shown by black lines). After 335 frames, CRISP outperforms the pushbroom by a factor of five for the 40° C. blackbody source and by a factor of three for the 138° C. blackbody source. The measured performance enhancements at 335 frames for both the 40° C. and 138° C. blackbody sources are within the theoretical upper-bound expected for a detector-noise limited measurement ($\sqrt{M}/2 \approx 9$), and the theoretical lower-bound expected for a shot-noise limited measurement ($\sqrt{M/(2 \cdot N_\lambda)} \approx 1.5$; $N_\lambda = 67$).

The spectrometer 400 has an optical throughput of 11%, which suggests 40-70 mK effective shot noise for the measurements of the 40° C. and 138° C. blackbody sources. The measured detector noise is 100-200 mK, which puts the measurements in a modestly detector-noise limited regime. Regardless of whether the spectrometer 400 operates in a shot-noise limited or a detector-noise limited regime, the SNR should improve as $\sqrt{M}$, which is clearly shown in FIG. 7. Larger format imagers should increase the CRISP SNR. Detector-noise limited performance can be approached via a combination of higher optical throughput and a more carefully measured mask function used to decode the hyperspectral cube.

Spectroscopic Analysis of Trace Gases

FIGS. 8A-8D illustrate the spectrometer's ability to perform spectroscopic analysis of trace gases. In these measurements, the spectrometer 400 made hyperspectral measurements of a thin polyethylene bag (about 80% transmissive in the LWIR) with a trace amount (about 2000 ppm) of 1,1,1,2-tetrafluoroethane (R-134a) gas, buffered with nitrogen to 1 atm. The bag was positioned between the spectrometer and a blackbody source set to 100° C.

FIG. 8A shows measured (squares) and computed (line) transmission spectra of the bag at room temperature. The measured transmission spectrum is referenced to a measurement of a polyethylene bag filled with only nitrogen and closely resembles the computed transmission spectrum, which was computed from data in the Pacific Northwest National Laboratory (PNNL) database available at https://nwir.pnl.gov/.

FIG. 8B shows measured and computed emission spectra for the same bag of R-134a heated to a temperature of about 50° C. The measured emission spectrum in FIG. 8B is the difference between the raw measurement and a room-temperature blackbody spectrum baseline. Again, the measured data closely matches the emission spectrum computed from the PNNL database. (The spectra displayed in FIGS. 8A and 8B are the result of 100-pixel-by-100-pixel averaging.)

FIGS. 8C and 8D show the computational reconfigurable imaging spectrometer's ability to detect and locate a trace gas within the scene. For this experiment, the bag of trace R-134a gas was placed next to a bag full of room air between a 100° C. blackbody radiator, shown at left in FIG. 8C, and the spectrometer 400. The bag of air in this case simply exists as the null experiment. FIG. 8D is a heat map produced from the data of FIG. 8C that shows the location of the R-134a in the scene. The heat map is produced by simply plotting the height of a known peak in the transmission spectrum of the R-134a gas. A white dotted border depicts the perimeter of the extended blackbody source.

Example Application Showing CRISP Impact

FIG. 9 illustrates the performance potential of a computational reconfigurable imaging spectrometer for space-based infrared sounding. It shows the predicted and simulated noise equivalent temperature difference (NETD) for a computational reconfigurable imaging spectrometer and for a standard pushbroom spectrometer versus detector array size for the NASA Atmospheric Infrared Sounder (AIRS) specification. The NASA AIRS specification is for an LWIR temperature sounding sensor with roughly 12 nm spectral resolution in a spectral band from 13.5 µm to 15 µm, and 8 km spatial resolution.

FIG. 9 shows that a computational reconfigurable imaging spectrometer with an uncooled microbolometer array as the focal plane array over a pushbroom spectrometer with an uncooled microbolometer. This analysis assumes that the both spectrometers operate in the presence of the same spatial and temporal noise. As can be seen in FIG. 9, the NETD of a CRISP system is more than an order of magnitude lower for modest focal plane sizes and can match NASA sounder sensitivity requirements. Analyses of other hyperspectral and multispectral imaging systems show similar gains, covering a wide gamut of spatial and spectral ranges and resolution capabilities. In addition, the computational reconfigurable imaging spectrometer would also have significant SWaP advantages over a spectrometer with a cooled HgCdTe focal plane array.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the technology disclosed herein may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes (e.g., of designing and making the technology disclosed above) outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or"

should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A hyperspectral imaging system comprising:
   a first dispersive element to disperse an image moving laterally with respect to an optical axis of the hyperspectral imaging system into N spectral components;
   a coding mask, in optical communication with the first dispersive element, to encode the N spectral components with a predetermined code;
   a second dispersive element, in optical communication with the coding mask, to recombine the N spectral components into an encoded image;
   a detector array, in optical communication with the second dispersive element and having M≥N detector elements, to detect the encoded image; and
   a processor, operably coupled to the detector array, to form a reconstructed version of the image from the encoded image with a coding gain of $\sqrt{M/2N}$,
   wherein M and N are positive integers.

2. The hyperspectral imaging system of claim 1, wherein the coding mask is a static coding mask and the predetermined code is at least one of a binary Walsh-Hadamard S-matrix code or a random binary code.

3. The hyperspectral imaging system of claim 1, wherein the detector array comprises an uncooled microbolometer array configured to detect long-wave infrared radiation.

4. The hyperspectral imaging system of claim 1, wherein M/N>10.

5. The hyperspectral imaging system of claim 1, wherein M/N>100.

6. The hyperspectral imaging system of claim 1, wherein the image moves fast enough to cause motion blur in the reconstructed version of the image and the processor is configured to estimate the motion blur from the reconstructed version of the image based on the predetermined code.

7. The hyperspectral imaging system of claim 1, wherein the detector array is configured to acquire a sequence of encoded images as the image moves laterally with respect to the optical axis of the hyperspectral imaging system and the processor is configured to estimate a trajectory of the image with respect to the hyperspectral imaging system based on the sequence of encoded images.

8. The hyperspectral imaging system of claim 1, further comprising:
   a first lens, in optical communication with the coding mask, to focus the N spectral components onto the coding mask; and
   a second lens, in optical communication with the coding mask and the detector array, to relay the encoded image to the detector array.

9. A method of hyperspectral imaging system, the method comprising:
   dispersing a laterally moving image into N spectral components;
   focusing the N spectral components onto a coding mask patterned with a predetermined code;
   encoding the N spectral components with the predetermined code;
   recombining the N spectral components into a laterally moving encoded image;
   detecting the laterally moving encoded image with a detector array having M≥N resolvable detector elements; and
   forming a reconstructed version of the laterally moving image from the laterally moving encoded image with a coding gain of $\sqrt{M/2N}$,
   wherein M and N are positive integers.

10. The method of claim 9, wherein encoding the N spectral components comprises illuminating a static coding mask with a binary Walsh-Hadamard S-matrix code with the N spectral components.

11. The method of claim 9, wherein the laterally moving image moves fast enough to cause motion blur in the reconstructed version of the image, and further comprising:
removing the motion blur from the reconstructed version of the image based on the predetermined code.

12. The method of claim 9, further comprising:
reconfiguring the coding mask to improve spatial resolution when reconstructing the laterally moving image from the laterally moving encoded image.

13. A method of hyperspectral imaging, the method comprising:
dispersing a laterally moving image into N spectral components;
focusing the N spectral components onto a coding mask patterned with a predetermined code;
encoding the N spectral components with the predetermined code;
recombining the N spectral components into a laterally moving encoded image; and
detecting the laterally moving encoded image with a detector array having M resolvable detector elements, wherein M and N are positive integers
wherein the laterally moving encoded image is a first laterally moving encoded image, and further comprising:
detecting a second laterally moving encoded image with the detector array after the image has moved by at least one resolvable spot with respect to the detector array; and
estimating a trajectory of the laterally moving image based on the first laterally moving encoded image and the second laterally moving encoded image.

14. A method of hyperspectral imaging claim 9, the method comprising:
dispersing a laterally moving image into N spectral components;
focusing the N spectral components onto a coding mask patterned with a predetermined code;
encoding the N spectral components with the predetermined code;
recombining the N spectral components into a laterally moving encoded image;
detecting the laterally moving encoded image with a detector array having resolvable detector elements, wherein M and N are positive integers; and
reconfiguring the coding mask to improve spectral resolution when reconstructing the laterally moving image from the laterally moving encoded image.

15. A method of hyperspectral imaging, the method comprising:
separating a moving image into N spectral components propagating orthogonal to a direction of motion of the moving image;
focusing the N spectral components onto at least M spatially resolvable elements in a binary static mask;
recombining the N spectral components to form an encoded moving image;
sampling at least M spatially resolvable spots of the encoded moving image at a frame rate f to form a hyperspectral data cube; and
forming a reconstruction of the moving image with a coding gain of $\sqrt{M/2N}$ based on the hyperspectral data cube.

16. The method of claim 15, wherein sampling the at least M spatially resolvable spots of the encoded moving image comprises detecting long-wave infrared light with an uncooled bolometer array.

17. The method of claim 15, wherein the binary static mask applies a predetermined code to data in the hyperspectral data cube represented by a measurement matrix $\varphi$ and forming the reconstruction of the moving image comprises estimating spectra of the moving image with a pseudoinverse $\varphi^+$ of the measurement matrix.

18. The method of claim 17, wherein estimating the spectra comprises minimizing a mean squared error (MSE) equal to $(\sigma^2/M)\mathrm{Trace}(\varphi^+\varphi)^{-1}$, where $\sigma^2$ represents a variance of measurement noise associated with sampling the at least M spatially resolvable spots of the encoded moving image.

19. The method of claim 15, further comprising:
resolving motion of the moving image during a frame integration period T=1/f based on at least a portion of the hyperspectral data cube; and
compensating the motion of the moving image during the frame integration period T=1/f in the reconstruction of the moving image.

20. The method of claim 15, further comprising:
estimating a trajectory of the moving image based on at least a portion of the hyperspectral data cube.

* * * * *

UNITED STATES PATENT AND TRADEMARK OFFICE
CERTIFICATE OF CORRECTION

PATENT NO. : 10,909,670 B2
APPLICATION NO. : 16/212013
DATED : February 2, 2021
INVENTOR(S) : Adam Milstein et al.

It is certified that error appears in the above-identified patent and that said Letters Patent is hereby corrected as shown below:

In the Claims

Column 19 In Claim 13, Line 21, replace "detector array having M resolvable detector elements" with --detector array having $M \geq N$ resolvable detector element--

Column 19 In Claim 14, Line 33, replace "A method of hyperspectral imaging claim 9," with --A method of hyperspectral imaging,--

Column 19 In Claim 14, Line 44, replace "detector array having resolvable detector elements," with --detector array having $M \geq N$ resolvable detector elements,--

Signed and Sealed this
First Day of June, 2021

Drew Hirshfeld
*Performing the Functions and Duties of the*
*Under Secretary of Commerce for Intellectual Property and*
*Director of the United States Patent and Trademark Office*